United States Patent
Lin et al.

(10) Patent No.: US 11,121,283 B2
(45) Date of Patent: Sep. 14, 2021

(54) METHOD FOR TRANSFERRING LIGHT EMITTING ELEMENTS, AND METHOD FOR MAKING DISPLAY PANEL

(71) Applicant: Century Technology (Shenzhen) Corporation Limited, Shenzhen (CN)

(72) Inventors: Yung-Fu Lin, New Taipei (TW); Po-Liang Chen, New Taipei (TW)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 166 days.

(21) Appl. No.: 16/703,008

(22) Filed: Dec. 4, 2019

(65) Prior Publication Data

US 2021/0005776 A1   Jan. 7, 2021

(30) Foreign Application Priority Data

Jul. 5, 2019   (CN) .......................... 201910604717.X

(51) Int. Cl.
| | |
|---|---|
| *H01L 21/00* | (2006.01) |
| *H01L 33/00* | (2010.01) |
| *H01L 21/677* | (2006.01) |
| *H01L 25/075* | (2006.01) |

(52) U.S. Cl.
CPC .... *H01L 33/0095* (2013.01); *H01L 21/67709* (2013.01); *H01L 25/0753* (2013.01)

(58) Field of Classification Search
CPC .......... H01L 33/0095; H01L 21/67709; H01L 25/0753; H01L 24/95; H01L 21/67144; H01L 27/156; H01L 21/683; H01L 33/48; H01L 2933/0033
See application file for complete search history.

(56) References Cited

U.S. PATENT DOCUMENTS

| | | | | |
|---|---|---|---|---|
| 2017/0294421 | A1* | 10/2017 | Huang | ................... H01L 21/68 |
| 2019/0156733 | A1* | 5/2019 | Park | ................... H01L 27/1255 |
| 2020/0091370 | A1* | 3/2020 | Ting | ......................... G09F 9/33 |
| 2020/0303359 | A1* | 9/2020 | Robin | ................... H01L 33/382 |
| 2020/0403118 | A1* | 12/2020 | Kim | ......................... G09F 9/33 |
| 2021/0005642 | A1* | 1/2021 | Chen | ................... H01L 27/1259 |
| 2021/0005643 | A1* | 1/2021 | Chen | ................... H01L 27/1248 |
| 2021/0005775 | A1* | 1/2021 | Chen | ................... H01L 25/0753 |
| 2021/0090916 | A1* | 3/2021 | Yang | ................... H01L 21/67144 |
| 2021/0090925 | A1* | 3/2021 | Yang | ....................... H01L 24/81 |
| 2021/0090928 | A1* | 3/2021 | Yang | ................... H01L 21/67709 |
| 2021/0090929 | A1* | 3/2021 | Yang | ....................... H01L 21/50 |
| 2021/0175387 | A1* | 6/2021 | Ting | ....................... H01L 24/95 |

* cited by examiner

*Primary Examiner* — Ismail A Muse
(74) *Attorney, Agent, or Firm* — ScienBiziP, P.C.

(57) ABSTRACT

A method for transferring a large number of light emitting elements in a single operation during display panel manufacture includes providing a receiving substrate with light emitting elements; orienting the light emitting elements on a first platform by a first electromagnetic plate; transferring the light emitting elements on the first platform to a second platform by a second electromagnetic plate; and transferring the light emitting elements on the second platform to the receiving substrate by a third electromagnetic plate. Each light emitting element undergoes a coarse positioning and finer positionings during the transfer process, so an accuracy of the light emitting elements is high.

14 Claims, 16 Drawing Sheets

METHOD FOR TRANSFERRING LIGHT EMITTING ELEMENTS, AND METHOD FOR MAKING DISPLAY PANEL

FIELD

The subject matter herein generally relates to display field, and particularly relates to a method for transferring light emitting elements and a method for making a display panel.

BACKGROUND

The size of a light emitting element such as light emitting diode (light emitting element) is always tending towards being made smaller, and it becomes increasingly difficult to transfer a large number of light emitting elements to a receiving substrate in a single operation.

Therefore, there is room for improvement in the art.

BRIEF DESCRIPTION OF THE DRAWINGS

Implementations of the present disclosure will now be described, by way of embodiment, with reference to the attached figures.

DETAILED DESCRIPTION

Figure 1:
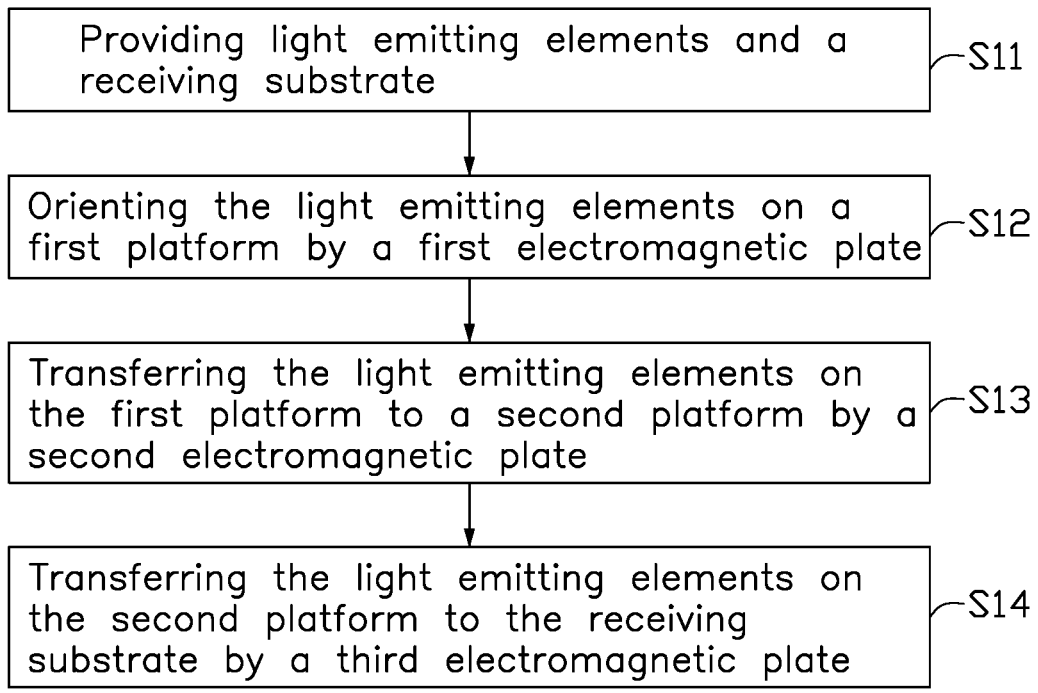
FIG. 1 is a flow chart of a method for transferring light emitting elements.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". The term "circuit" is defined as an integrated circuit (IC) with a plurality of electric elements, such as capacitors, resistors, amplifiers, and the like.

Referring to FIG. 1, a flowchart of a method for transferring light emitting elements during a process of manufacture in one embodiment is disclosed. The method is provided by way of embodiment, as there are a variety of ways to carry out the method. The method described below can be carried out using the configurations illustrated in FIGS. 2 through 14 for example, and various elements of these figures are referenced in explaining the method. Each block in this method represents one or more processes, methods, or subroutines, carried out in the method. Additionally, the illustrated order of blocks is by example only and the order of the blocks can change. The method can begin at Block S11.

Block S11: a receiving substrate 10 and a plurality of light emitting elements 20 are provided.

Figure 2:
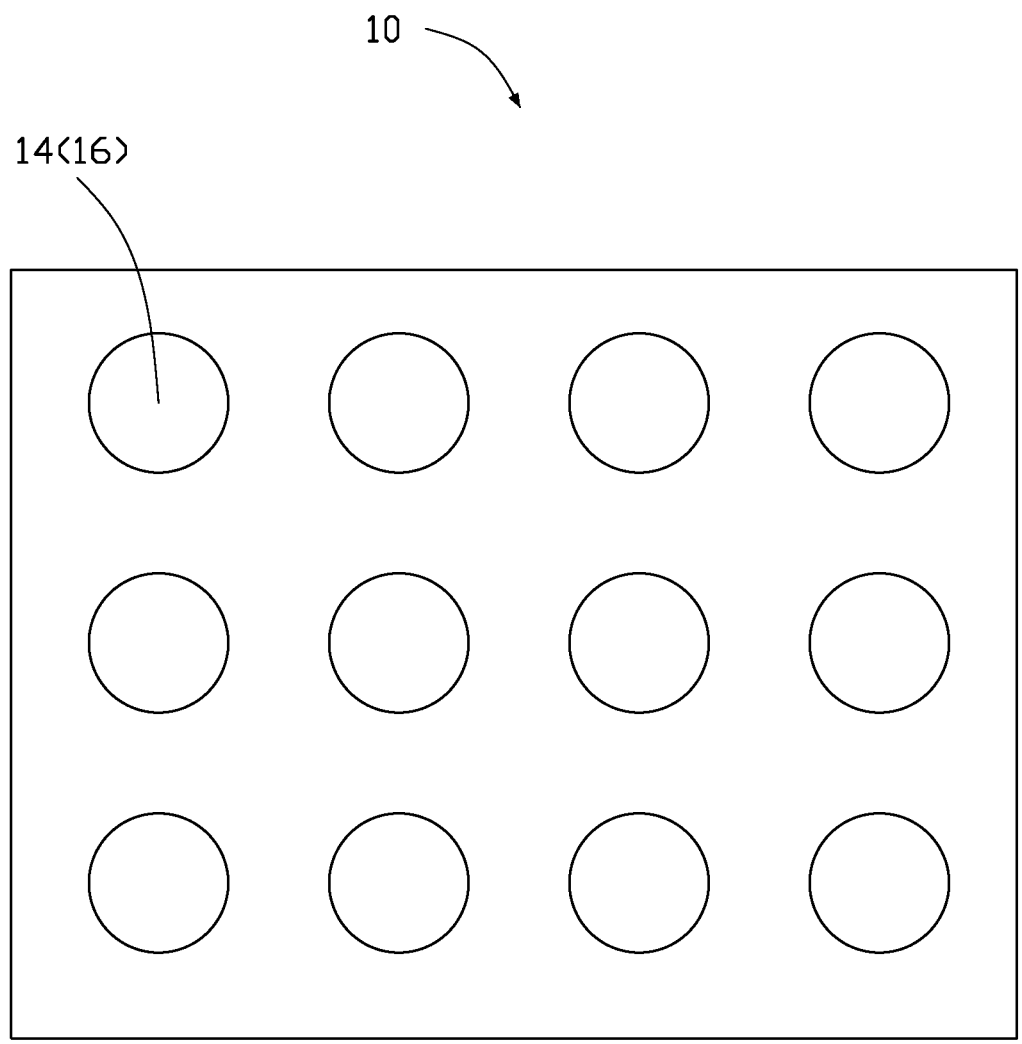
FIG. 2 is a top planar view illustrating a receiving substrate during Block S11 in the method of FIG. 1.

The receiving substrate 10 as shown in FIG. 2 defines a plurality of receiving areas 14, and each receiving area 14 is configured for receiving one light emitting element 20.

In one embodiment, the receiving substrate 10 is a thin film transistor (TFT) substrate. The receiving substrate 10 includes a substrate 11, a TFT array layer 12, and an insulating layer, the TFT layer 12 being sandwiched between the substrate 11 and the insulating layer. The TFT array layer 12 includes a plurality of TFTs (not shown). The insulating layer 13 defines a plurality of receiving holes 16 exposing the TFT array layer 12. Each receiving hole 16 functions as one receiving area 14.

In one embodiment, the substrate 11 may be made of a rigid material, such as glass, quartz, or silicon wafer. In other embodiments, the substrate 11 may be made of a flexible material such as polyimide (PI) or polyethylene terephthalate (PET).

Figure 3:
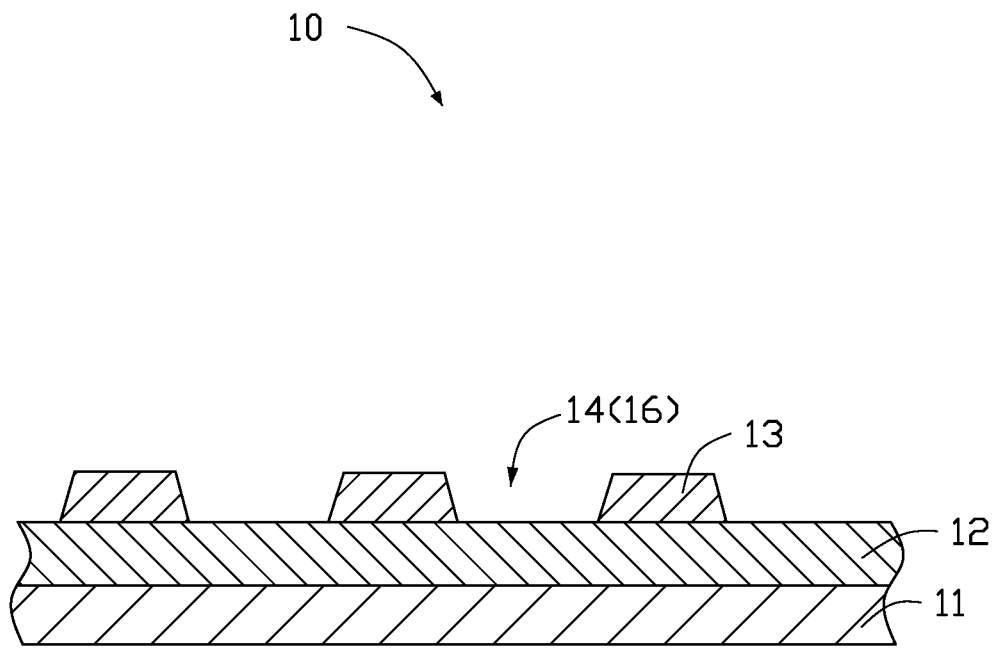
FIG. 3 is a cross-sectional view illustrating the receiving substrate during Block S11.
Figure 4:
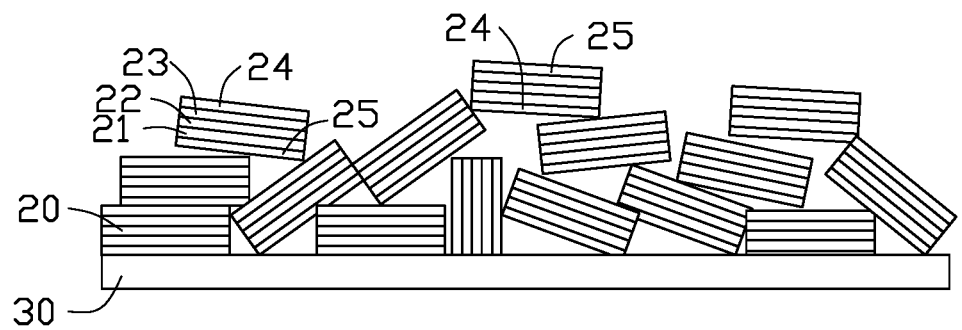
FIG. 4 is a schematic diagram illustrating the light emitting elements during Block S11.

The light emitting elements 20 as shown in FIG. 3 are placed on a first platform 30 in one mass. In one embodiment, opposite ends of each light emitting element 20 carry a first electrode 24 and a second electrode 25. The first electrode 24 and the second electrode 25 may be made of a magnetic material of opposite magnetic properties. The first electrode 24 of some light emitting elements 20 faces upward, and the second electrode 25 of some light emitting elements 20 faces upward.

Each light emitting element 20 includes a P-type doped phosphor layer 21, an N-doped phosphor layer 23, and an active layer 22 between the P-type doped phosphor layer 21 and the N-doped phosphor layer 23. The P-type doped phosphor layer 21 is electrically connected to the second electrode 25, and the N-doped phosphor layer 23 is electrically connected to the first electrode 24.

The first electrode 24 and the second electrode 25 have opposing magnetic poles. For example, the magnetic pole of the first electrode 24 is N pole, the magnetic pole of the second electrode 25 is S pole, or the magnetic pole of the first electrode 24 is S pole and the magnetic pole of the second electrode 25 is N pole.

In one embodiment, the first electrode 24 and the second electrode 25 may be made of a magnetic material, such as an aluminum-nickel-cobalt permanent magnet alloy, an iron-chromium-nickel permanent magnet alloy, a permanent magnet ferrite, other rare earth permanent magnet materials, or a composite permanent magnet material composed of the above materials.

In another embodiment, the magnetic material of opposite magnetic properties is not integral with an electrode of the light emitting element 20. The first electrode 24 and the second electrode 25 of each light emitting element 20 are then provided with magnetic materials of opposing poles.

In an embodiment, the light emitting element 20 is a conventional light emitting diode (LED), mini LED, or micro LED. "Micro LED" means LED with grain size less than 100 microns. The mini LED is also a sub-millimeter LED, and its size is between conventional LED and micro LED. "Mini LED" generally means LED with grain size of about 100 microns to 200 microns.

In Block S12: the light emitting elements 20 on the first platform 30 are oriented by a first electromagnetic plate 40. The first electromagnetic plate 40 magnetically attracts the light emitting elements 20 on being energized. The first electrode 24 (or the second electrode 25) of each light emitting element 20 can be face-up on the first platform 30.

In one embodiment, the first electromagnetic plate 40 includes a control circuit (not shown). The control circuit is configured to supply a voltage or current to the first electromagnetic plate 40 to energize the plate 40 and make it magnetic.

In addition, a magnetic strength of the first electromagnetic plate 40 can be controlled by adjusting a magnitude of the voltage or the current applied to the first electromagnetic plate 40 by the control circuit.

In order to make a light emitting surface of each light emitting element 20 face up on the receiving substrate 10 in the Block S12, each light emitting element 20 is transferred to the first platform 30 with its light emitting surface facing upward. That is, if light from each light emitting element 20 is emitted from the first electrode 24, the first electrode 24 faces upward and is placed on the first platform 30. If light from each light emitting element 20 is emitted from the second electrode 25, the second electrode 25 faces upward and is placed accordingly on the first platform 30.

If the first electrode 24 faces upward on the first platform 30, the first electromagnetic plate 40 generates magnetism opposite to that of the first electrode 24 on being energized. If the second electrode 25 faces upward on the first platform 30 the first electromagnetic plate 40 generate magnetism opposite to that of the second electrode 25 on being energized. That is, a type of the first electromagnetic plate 40 can be selected and used according to the magnetic properties of the electrodes of the light emitting elements 20.

In one embodiment, the first electromagnetic plate 40 further includes a mechanical arm (not shown) to grasp and manipulate the first electromagnetic plate 40, up and down and to either side.

Figure 5:
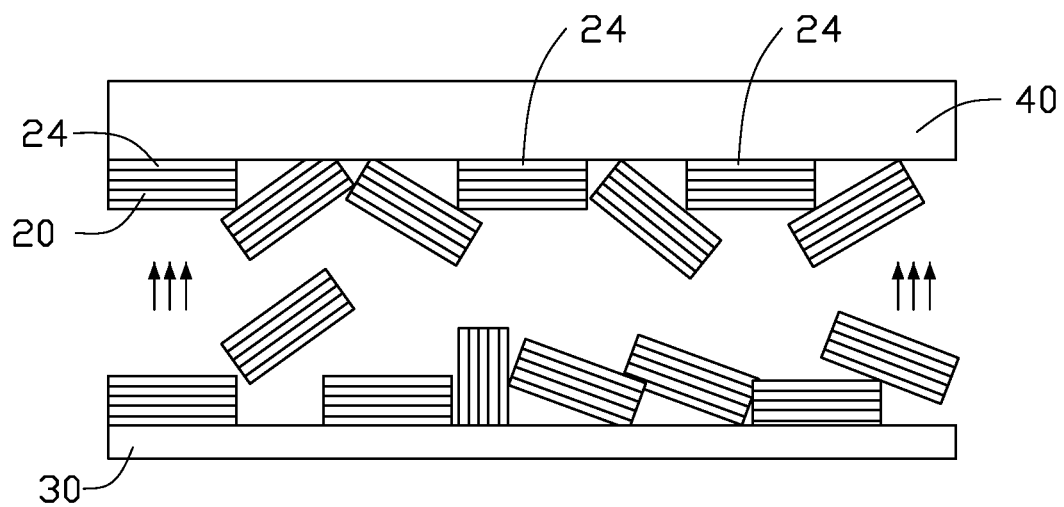
FIG. 5 and FIG. 6 are schematic diagrams illustrating the process of Block S12.

In FIG. 5, the control circuit in the first electromagnetic plate 40 is turned on, and a voltage or current is applied to the first electromagnetic plate 40. When the voltage or current is applied to the first electromagnetic plate 40, the first electromagnetic plate 40 generates magnetism opposite to the magnetic pole of the first electrode 24 (i.e., magnetic material) of each light emitting element 20. The first electrode 24 of each light emitting element 20 is attracted to the first electromagnetic plate 40 due to magnetic force.

Figure 6:
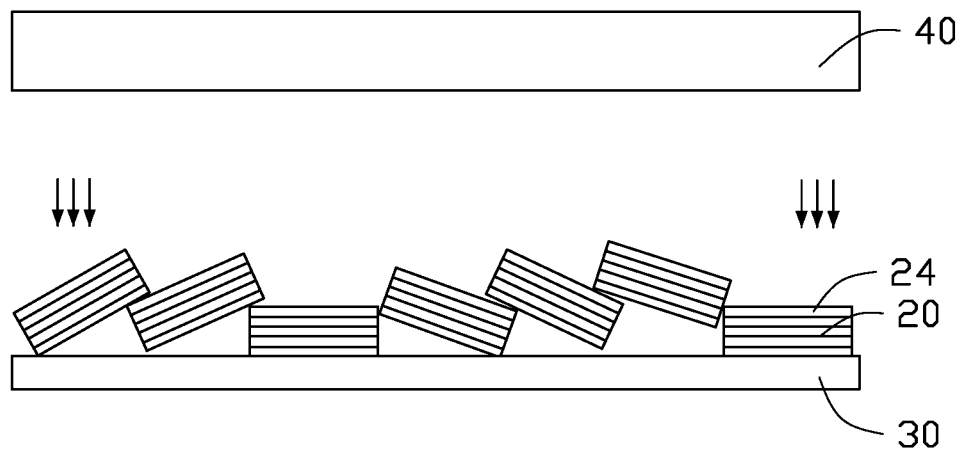

In FIG. 6, the control circuit in the first electromagnetic plate 40 is turned off, and the light emitting elements 20 drop onto the first platform 30 due to gravitational attraction, the first electrode 24 of each light emitting element 20 facing upward. Therefore, an alignment of the light emitting elements 20 is achieved.

Block S13: the light emitting elements 20 on the first platform 30 are transferred to a second platform 70 by a second electromagnetic plate 50.

Figure 7:
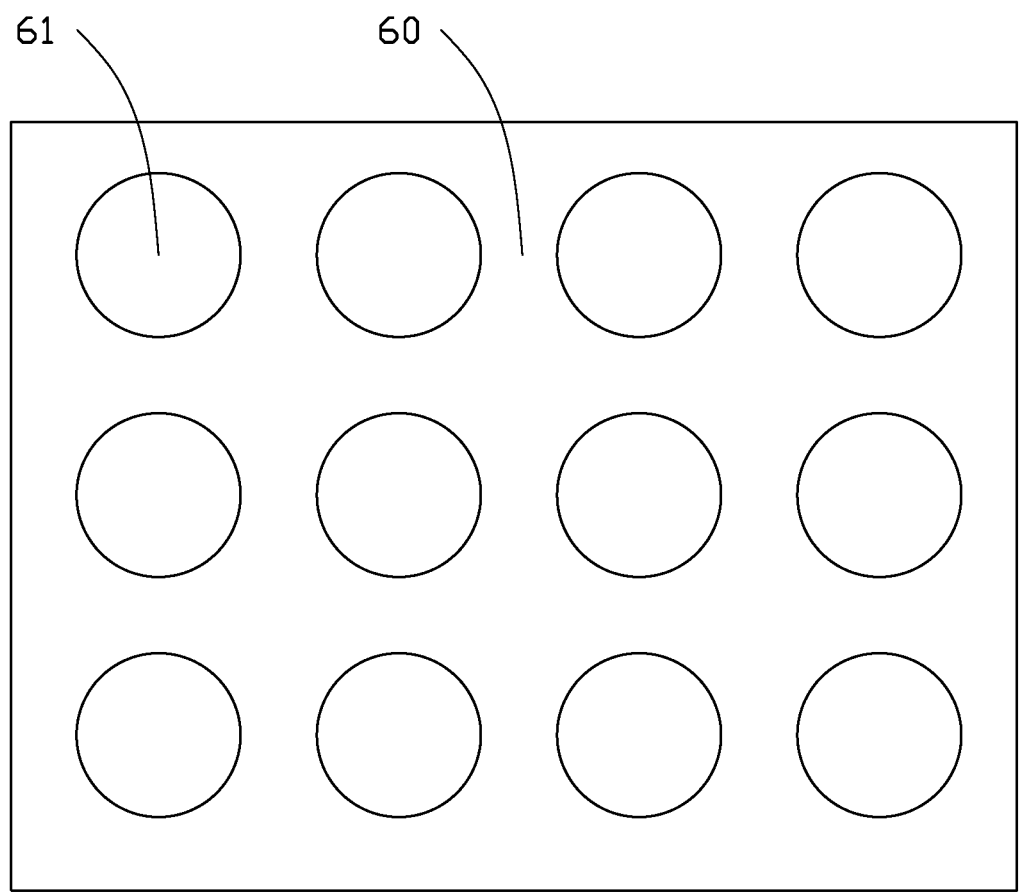
FIG. 7, FIG. 8, and FIG. 9 are cross-sectional views illustrating the process of Block S13.
Figure 8:
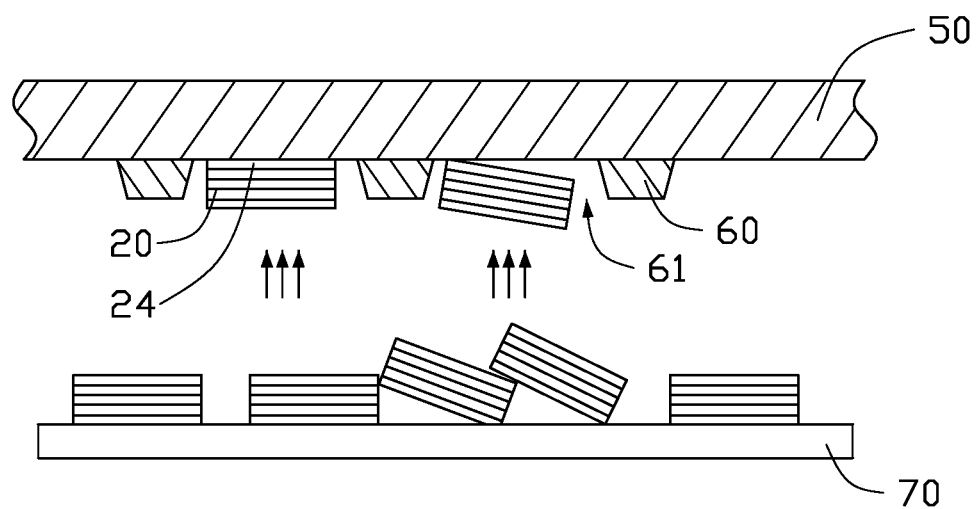
Figure 9:
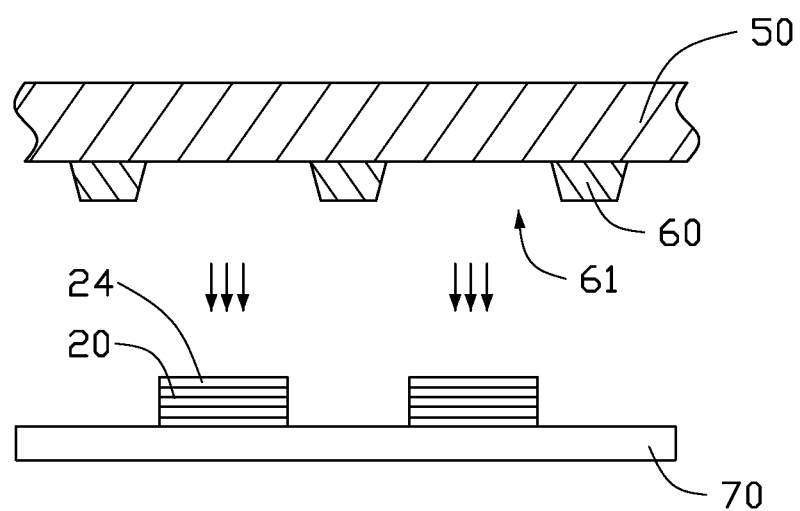

The second electromagnetic plate 50 may be made of a material being magnetic when energized and having no magnetism when not energized. As shown in FIGS. 7 through 9, a first insulating nonmagnetic material layer 60 is created on a surface of the second electromagnetic plate 50. The first insulating nonmagnetic material layer 60 defines a plurality of first through holes 61 spaced apart from each other, and the surface of the first electromagnetic plate 50 is exposed from the first through holes 61. Each first through hole 61 is defined as one first adsorption position 61. Each first adsorption position 61 is capable of magnetically attracting one light emitting element 20 on being energized. The adjacent first through holes 61 are spaced apart from each other by the first insulating nonmagnetic material layer 60. The first through holes 61 and the receiving areas 14 shown in FIG. 2 are in one-to-one correspondence in number and position.

When the second electromagnetic plate 50 is energized, the positions of the first through holes 61 (i.e., the exposed surfaces of the second electromagnetic plate 50) magnetically adsorb one end of the light emitting element 20, thereby pulling one of the light emitting elements 20 into one of the first through holes 61. Other positions are not magnetic. That is, when the second electromagnetic plate 50 is energized, only the positions corresponding to the first through holes 61 have magnetic properties. A size of each first through hole 61 is slightly larger than the size of the light emitting element 20, each of the first through holes 61 can adsorb only one of the light emitting elements 20.

In one embodiment, the first insulating nonmagnetic material layer 60 may be made of a polyimide-based composite material.

As shown in FIG. 8, the size of each first through hole 61 is larger than the size of the light emitting element 20 to be adsorbed, and each first through hole 61 can adsorb only one light emitting element 20. After each first through hole 61 adsorbs one light emitting element 20, there is still a gap between the wall of the hole of the first through hole 61 and the light emitting element 20.

In one embodiment, a mechanical arm (not shown) is further provided on a side of the second electromagnetic plate 50 away from the first insulating nonmagnetic material layer 60, to grasp and manipulate the second electromagnetic plate 50, up and down and to either side.

In one embodiment, a control circuit (not shown) is further provided corresponding to the second electromagnetic plate 50. The control circuit is configured to supply a voltage or current to the second electromagnetic plate 50 to energize the second electromagnetic plate 50 and make it magnetic. In addition, a magnetic strength of the second electromagnetic plate 50 can be controlled by adjusting a magnitude of the voltage or the current applied to the second electromagnetic plate 50 by the control circuit.

In FIG. 8, the control circuit in the second electromagnetic plate 50 is turned on, and a voltage is applied to the second electromagnetic plate 50 by the control circuit. When the voltage is applied to the second electromagnetic plate 50, the second electromagnetic plate 50 generates magnetism opposite to the magnetic pole of the first electrode 24 of each light emitting element 20. The light emitting elements 20 on the first platform 30 are attracted to the first through holes 61 due to the magnetic force. Each position of the second electromagnetic plate 50 corresponding to each first through hole 61 can adsorb one light emitting element 20. The positions of the second electromagnetic plate 50 having no first through holes 61 are not magnetic and do not absorb any of the light emitting elements 20 due to the first insulating nonmagnetic material layer 60.

After the second electromagnetic plate 50 corresponding to the position of each first through hole 61 adsorbs one light emitting element 20 as shown in FIG. 9, the second electromagnetic plate 50 remains energized, and moves over a second platform 70. When the control circuit in the second electromagnetic 50 is turned off, each light emitting element 20 magnetically attracted by the second electromagnetic plate 50 drops on the first platform 30 due to gravitational attraction, and the first electrode 24 of each light emitting element 20 is facing upward.

The first through holes 61 on the second electromagnetic plate 50 are in one-to-one correspondence with the receiving areas 14, so that the light emitting elements 20 on the second platform 70 and the receiving areas 14 of the receiving substrate 10 also have a one-to-one correspondence. That is, light emitting elements 20 on the second platform 70 are now roughly positioned.

Block S14: the light emitting elements 20 on the second platform 70 are transferred to the receiving substrate 10 by a third electromagnetic plate 80.

The third electromagnetic plate 80 may be made of a material being magnetic when energized and having no magnetism when not energized.

Figure 10:
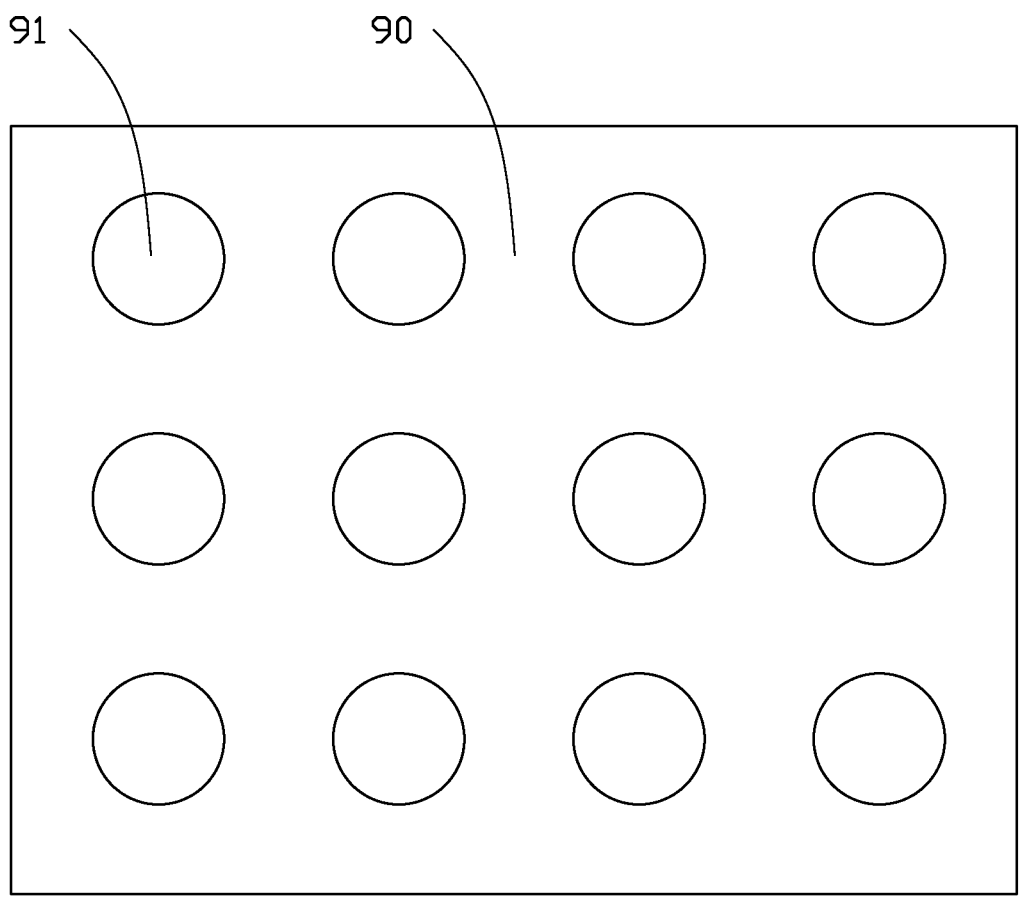
FIG. 10, FIG. 11, and FIG. 12 are schematic views illustrating the process of Block S14.
Figure 11:
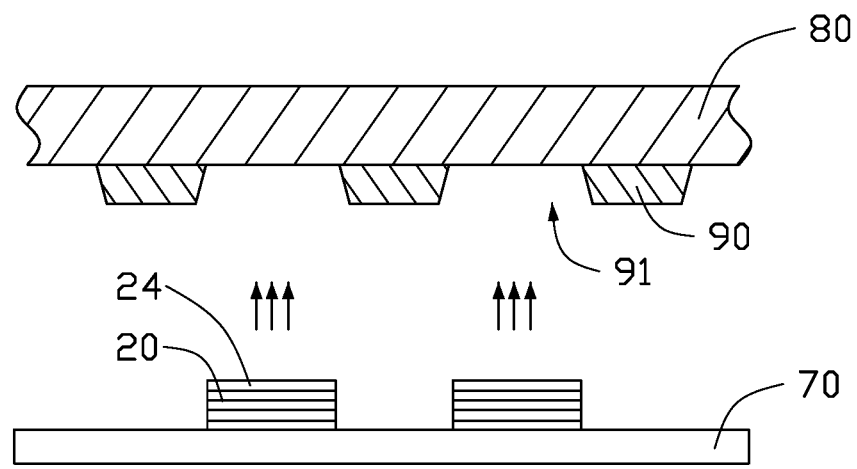
Figure 12:
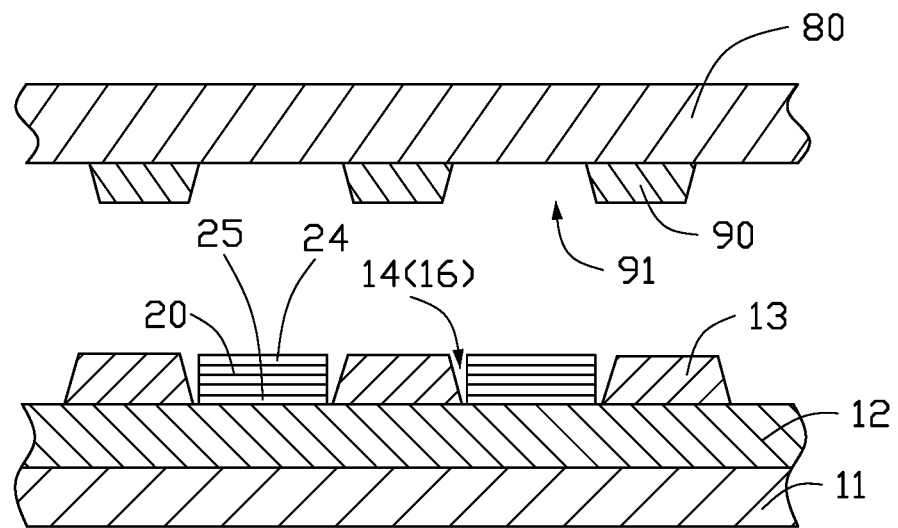

As shown in FIGS. 10 through 12, a second insulating nonmagnetic material layer 90 is on a surface of the third electromagnetic plate 80. The second insulating nonmagnetic material layer 90 defines a plurality of second through holes 91 spaced apart from each other, and the surface of the third electromagnetic plate 80 is exposed from the second through holes 91. Each second through hole 91 is defined as one second adsorption position 91. Each second adsorption position 91 is capable of magnetically attracting one light emitting element 20 on being energized. The adjacent second through holes 91 are spaced apart from each other by the second insulating nonmagnetic material layer 90. The second through holes 91 shown in FIG. 10 and the receiving areas 14 shown in FIG. 2 are in one-to-one correspondence in number and position.

When the third electromagnetic plate 80 is energized, the positions of the second through holes 91 (i.e., the exposed surfaces of the third electromagnetic plate 80) magnetically adsorb one end of the light emitting element 20, thereby pulling one of the light emitting elements 20 into one of the second through holes 91. Other positions are not magnetic. That is, when the third electromagnetic plate 80 is energized, only the positions corresponding to the second through holes 91 have magnetic properties. A size of each second through hole 91 is larger than the size of each light emitting element 20 and smaller than the size of each first through hole 61 for fine positioning of the light emitting elements 20.

In one embodiment, the second insulating nonmagnetic material layer 90 may be made of a polyimide-based composite material. As shown in FIG. 11, the size of each second through hole 91 is larger than the size of the light emitting element 20 to be adsorbed, and each second through hole 91 can adsorb only one light emitting element 20. The distance between adjacent two second through holes 91 shown in FIG. 10 is greater than the distance between adjacent two first through holes 61 shown in FIG. 7. After each second through hole 91 adsorbs one light emitting element 20, there is a small gap between the hole wall of the second through hole 91 and the light emitting element 20.

In one embodiment, a mechanical arm (not shown) is further provided on a side of the third electromagnetic plate 80 away from the second insulating nonmagnetic material layer 90, to grasp and manipulate the third electromagnetic plate 80, up and down and to either side.

In one embodiment, a control circuit (not shown) is further provided for the third electromagnetic plate 80. The control circuit is configured to supply a voltage to the third electromagnetic plate 80 to energize the third electromagnetic plate 80 and make it magnetic. In addition, a magnetic strength of the second electromagnetic plate 50 can be controlled by adjusting a magnitude of the voltage or the current applied to the third electromagnetic plate 80 by the control circuit.

As shown in FIG. 2, FIG. 7, and FIG. 10, the first through holes 61 and the receiving areas 14 are in one-to-one correspondence with the receiving areas 14, and the second through holes 91 and the receiving areas 14 also have a one-to-one correspondence in number and position.

In FIG. 11, the third electromagnetic plate 80 is moved over the second platform 70, and the second through holes 91 and the light emitting elements 20 on the second platform 70 are aligned one on one. The control circuit in the third electromagnetic plate 80 is turned on, and a voltage is applied to the third electromagnetic plate 80 by the control circuit. When the voltage is applied, the third electromagnetic plate 80 generates magnetism opposite to the magnetic pole of the first electrode 24 of each light emitting element 20. The light emitting elements 20 on the second platform 70 are attracted to the corresponding second through hole 91 due to the magnetic force between the light emitting element 20 and the third electromagnetic plate 80. Each position of the third electromagnetic plate 80 corresponding to each second through hole 91 can adsorb one light emitting element 20. The positions of the third electromagnetic plate 80 having no second through holes 91 do not absorb any of the light emitting elements 20 due to the second insulating nonmagnetic material layer 90.

Since the size of each second through hole 91 is smaller than the size of each first through hole 61, the respective positions of the light emitting elements 20 on the second platform 70 adsorbed by the third electromagnetic plate 80 are further corrected.

After the third electromagnetic plate 80 corresponding to the position of each second through hole 91 adsorbs one light emitting element 20 as shown in FIG. 12, the third electromagnetic plate 80 remains energized, and is moved over the receiving substrate 10, so that each light emitting element 20 adsorbed on the third electromagnetic plate 80 is aligned one-to-one with the corresponding receiving area 14 on the receiving substrate 10.

After aligning each light emitting element 20 adsorbed on third electromagnetic plate 80 with the corresponding receiving area 14 on the receiving substrate 10, the control circuit of the third electromagnetic plate 80 is turned off, and each light emitting element 20 magnetically adsorbed by the third electromagnetic plate 80 and its first and second electrodes 24 and 25 are detached from the third electromagnetic plate 80 due to gravitational attraction and transferred to the corresponding receiving area 14. The first electrode 24 of each light emitting element 20 faces upward on the receiving area 14. Since the respective positions of the light emitting element 20 on the second platform 70 adsorbed by the third electromagnetic plate 80 are further corrected, the alignment of the light emitting elements 20 on the receiving area 14 is more accurate.

In one embodiment, the TFT array layer 12 includes a plurality of TFTs (not shown). After the light emitting elements 20 are transferred to the corresponding receiving areas 14, the second electrode 25 of each light emitting element 20 is electrically connected to one TFT, and the first electrode 24 of each light emitting element 20 is electrically connected to a driving circuit through wires to apply a voltage to the first electrode 24 of the light emitting element 20. When there is a forward bias between the first electrode 24 and the second electrode 25 of the light emitting element 20, the light emitting element 20 emits light.

In this method for transferring light emitting elements 20, a color of light emitted from each light emitting element 20 is not limited. After the first, second, and third electromagnetic plates 40, 50, and 80 are energized, their surfaces can magnetically adsorb a large number of light emitting elements 20 at one time, thus a large quantity of the light emitting elements 20 can be transferred in a single process.

In addition, in this method, each light emitting element 20 undergoes an initial coarse positioning and finer positionings during the transfer process, so an accuracy of the light emitting elements 20 is high.

In one embodiment, the method further includes steps of forming the first insulating nonmagnetic material layer 60 and thus defining the first through holes 61, and steps of forming the second insulating nonmagnetic material layer 90 and thus defining the second through holes 91.

Figure 13:
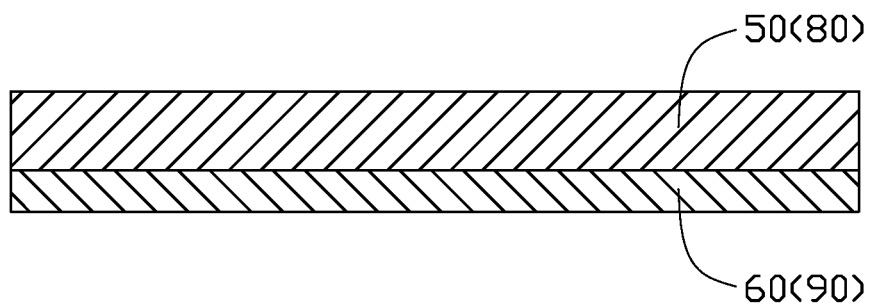
FIG. 13 and FIG. 14 are cross-sectional views illustrating in an embodiment the steps of forming a second electromagnetic plate and a third electromagnetic plate of the method of FIG. 1.

An electromagnetic plate is provided, and an insulating nonmagnetic material layer is formed on a surface of the electromagnetic plate, as shown in FIG. 13. In one embodiment, the material of the insulating nonmagnetic material layer may be a polyimide-based composite material laid in place by chemical vapor deposition (CVD). This can be done for the first, second, and third electromagnetic plates 40, 50, and 80. The insulating nonmagnetic material layer is used to form the first insulating nonmagnetic material layer 60 or the second insulating nonmagnetic material layer 90.

Figure 14:
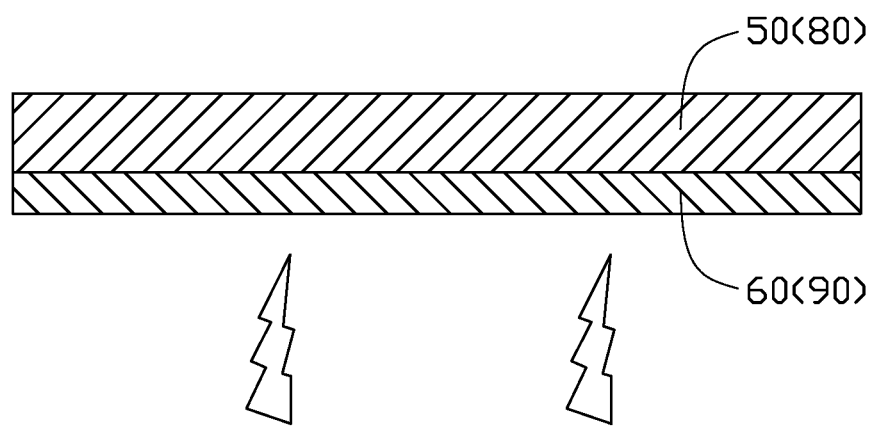

The insulating nonmagnetic material layer is patterned by laser lift-off to form a plurality of through holes exposing the electromagnetic plate, as shown in FIG. 14. The first insulating nonmagnetic material layer 60 is patterned to form the first through holes 61 exposing the second electromagnetic plate 50. The second insulating nonmagnetic material layer 90 is patterned to form the second through holes 91 exposing the third electromagnetic plate 80.

As shown in FIG. 12, the size of the receiving hole 16 on the receiving substrate 10 is larger than the size of the light emitting element 20. After the light emitting elements 20 are transferred to the corresponding receiving areas 14 of the receiving substrate 10, an infill layer 15 is formed on a side of the TFT array layer 12 away from the substrate 11. The infill layer 15 fills at least a periphery of each light emitting element 20 to locate and fix the light emitting element 20.

In one embodiment, after the step of forming the infill layer 15, the steps of wire preparation and packaging, are further included, thereby obtaining a display panel. In one embodiment, the light emitting elements 20 provided in Block S11 are light emitting elements emitting light of one color, such as light emitting elements emitting red light, light emitting elements emitting green light, light emitting elements emitting blue light, etc., thereby the display panel would be a monochrome display panel. The monochrome display panel can be applied to advertising signs, indicator lights, and the like.

In another embodiment, a method for making a color display panel is disclosed. The color display panel defines a plurality of pixels, and each pixel includes a plurality of sub-pixels. Each pixel includes a plurality of light emitting elements 20 emitting light of different colors. In one embodiment, each pixel can include a red (R) sub-pixel, a green (G) sub-pixel, and a blue (B) sub-pixel. The R, and B sub-pixels each correspond to one light emitting element 20. That is, each receiving area 14 of the receiving substrate 10 corresponds to one sub-pixel. In other embodiments, each pixel may include R, B, and W (white) sub-pixels. The W sub-pixel corresponds to one light emitting element 20 emitting white light. Each pixel may further include multi-color sub-pixels, and each multi-color sub-pixel corresponds to one light emitting element 20.

Figure 15:
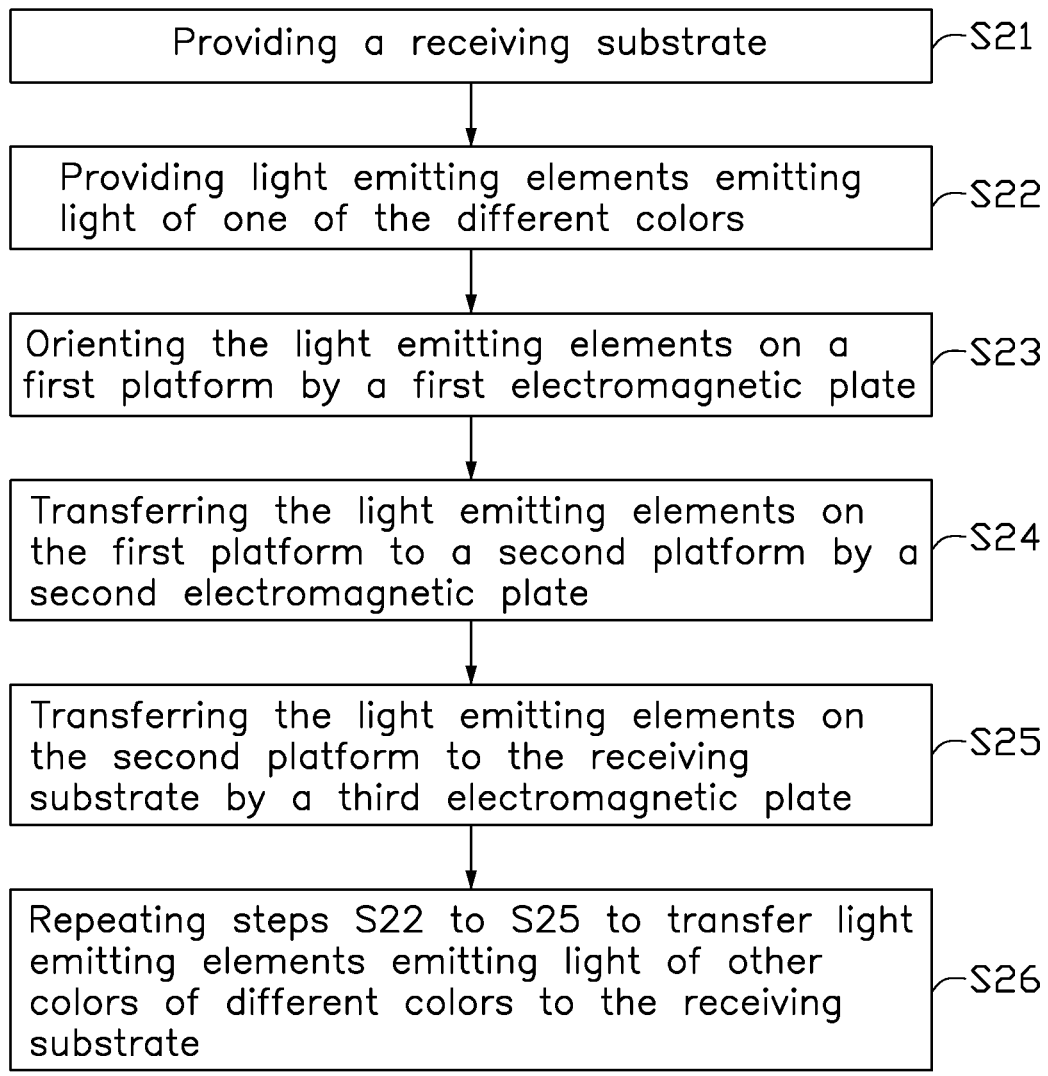
FIG. 15 is a flow chart of a method for making a display panel.
Figure 16:
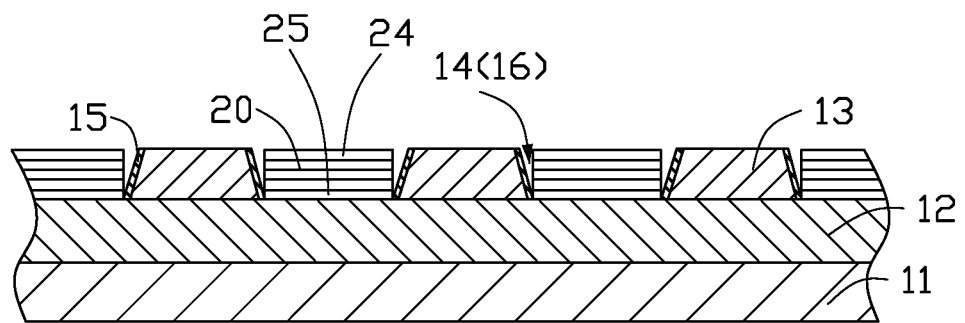
FIG. 16 is a cross-sectional view illustrating a step of forming an infill layer of the method of FIG. 15.

Referring to FIG. 15, a flowchart of the method for making the color display panel in one embodiment is disclosed. Each block in this method represents one or more processes, methods, or subroutines, carried out in the method. Additionally, the illustrated order of blocks is by example only and the order of the blocks can change. The method can begin at Block S21.

Block S21: a receiving substrate 10 is provided.

The receiving substrate 10 as shown in FIG. 2 defines a plurality of receiving areas 14, and each receiving area 14 is configured for receiving one light emitting element 20. That is, each receiving area 14 corresponds to one sub-pixel.

Block S22: the light emitting elements 20 emitting light of one of the different colors are provided.

Blocks S22 is similar to Block S11 except that in Block S22, the light emitting elements 20 provided emits light of one color.

Block S23: the light emitting elements 20 on the first platform 30 are oriented by a first electromagnetic plate 40.

Block S24: the light emitting elements 20 on the first platform 30 are transferred to a second platform 70 by a second electromagnetic plate 50.

Block S25: the light emitting elements 20 on the second platform 70 are transferred to the receiving substrate 10 by a third electromagnetic plate 80.

The Blocks S23 and S25 are the same as the above Blocks S12 to S14, and details are not described herein again.

Block S26: Blocks S22 to S25 are repeated to transfer light emitting elements 20 emitting light of other colors of the different colors to the receiving substrate 14.

In one embodiment, the size of the receiving hole 16 on the receiving substrate 10 is larger than the size of the light emitting element 20, and after the light emitting elements 20 are transferred to the corresponding receiving areas 14 of the receiving substrate 10, an infill layer 15 is formed on a side of the TFT array layer 12 away from the substrate 11. The infill layer 15 fills at least a periphery of each light emitting element 20 to locate and fix the light emitting element 20.

In one embodiment, after the step of forming the infill layer 15, the steps of wire preparation and packaging are further included, thereby obtaining the color display panel.

In this method for making the color display panel, after the first the first, second, and third electromagnetic plates 40, 50, and 80 are energized, their surfaces can magnetically adsorb a large number of light emitting elements 20 at one time, thus a large quantity of the light emitting elements 20 can be transferred in a single process. In addition, in this method, each light emitting element 20 undergoes an initial coarse positioning and finer positionings during the transfer process, so an accuracy of the light emitting elements 20 is high.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A method for transferring light emitting elements, comprising:
   providing a receiving substrate with a plurality of light emitting elements, wherein the receiving substrate defines a plurality of receiving areas, each of the plurality of receiving areas is configured for receiving one of the plurality of light emitting elements; each of the plurality of light emitting elements has a first end and a second end opposite to the first end, the first end and the second end are different poles with opposite magnetism;
   providing a first electromagnetic plate, wherein the first electromagnetic plate is capable of magnetically attracting the first end of each of the plurality of light emitting elements on being energized;
   providing a first platform and orienting the plurality of light emitting elements on the first platform by the first electromagnetic plate, and the first end of each of the plurality of light emitting elements is upward on the first platform;
   providing a second electromagnetic plate, wherein the second electromagnetic plate defines a plurality of first adsorption positions, each of the plurality of first adsorption positions is capable of magnetically attracting one light emitting element on being energized;
   providing a second platform and transferring the plurality of light emitting elements on the first platform to the second platform by the second electromagnetic plate, and each of the plurality of light emitting elements on the second platform is roughly positioned;
   providing a third electromagnetic plate, wherein the third electromagnetic plate defines a plurality of second adsorption positions, each of the plurality of second adsorption positions is capable of magnetically attracting one light emitting element on being energized, a size of each of the plurality of second adsorption positions is less than a size of each of the plurality of first adsorption positions;
   transferring the plurality of light emitting elements on the second platform to the receiving substrate by the third electromagnetic plate, wherein each of the plurality of light emitting elements is finely positioned and transferred to one corresponding receiving area of the receiving substrate.

2. The method according to claim 1, further comprising: forming a first insulating nonmagnetic material layer on a surface of the second electromagnetic plate; and defining a plurality of first through holes exposing the surface of the second electromagnetic plate in the first insulating nonmagnetic material layer, wherein each of the plurality of first through holes is defined as one of the plurality of first adsorption positions.

3. The method according to claim 2, further comprising: forming a second insulating nonmagnetic material layer on a surface of the third electromagnetic plate; and defining a plurality of second through holes exposing the surface of the third electromagnetic plate in second the insulating nonmagnetic material layer, wherein each of the plurality of second through holes is defined as one of the plurality of second adsorption positions.

4. The method according to claim 3, wherein forming both the first insulating nonmagnetic material layer and the second insulating nonmagnetic material layer are carried out by chemical vapor deposition.

5. The method according to claim 3, wherein defining both the plurality of first through holes and the plurality of second through holes are carried out by laser patterning.

6. The method according to claim 3, further comprising forming both the first insulating nonmagnetic material layer and the second insulating nonmagnetic material layer by a polyimide-based composite material.

7. A method for making a display panel comprising light emitting elements emitting light of different colors, comprising:
   S21: providing a receiving substrate, wherein the receiving substrate defines a plurality of receiving areas, each of the plurality of receiving areas is configured for receiving one of the plurality of light emitting elements;
   S22: providing a plurality of light emitting elements emitting light of one of the different colors, wherein each of the plurality of light emitting elements has a first end and a second end opposite to the first end, the first end and the second end are different poles with opposite magnetism;
   S23: orienting the plurality of light emitting elements on a first platform by a first electromagnetic plate, wherein the first electromagnetic plate is capable of magnetically attracting the first end of each of the plurality of light emitting elements on being energized, and the first end of each of the plurality of light emitting elements is upward on the first platform;
   S24: transferring the plurality of light emitting elements on the first platform to a second platform by a second electromagnetic plate, wherein the second electromagnetic plate defines a plurality of first adsorption positions, each of the plurality of first adsorption positions is capable of magnetically attracting one light emitting element on being energized, and each of the plurality of light emitting elements on the second platform is roughly positioned;
   S25: transferring the plurality of light emitting elements on the second platform to the receiving substrate by a third electromagnetic plate, wherein the third electromagnetic plate defines a plurality of second adsorption positions, each of the plurality of second adsorption positions is capable of magnetically attracting one light emitting element on being energized, a size of each of the plurality of second adsorption positions is less than a size of each of the plurality of first adsorption positions, and each of the plurality of light emitting elements is finely positioned and transferred to one corresponding receiving area of the receiving substrate;
   S26: repeating Blocks S22 to S25 to transfer light emitting elements emitting light of other colors of the different colors to the receiving substrate.

8. The method according to claim 7, further comprising: forming a first insulating nonmagnetic material layer on a surface of the second electromagnetic plate; and defining a plurality of first through holes exposing the surface of the second electromagnetic plate in the first insulating nonmagnetic material layer, wherein each of the plurality of first through holes is defined as one of the plurality of first adsorption positions.

9. The method according to claim 8, further comprising: forming a second insulating nonmagnetic material layer on a surface of the third electromagnetic plate; and defining a plurality of second through holes exposing the surface of the third electromagnetic plate in second the insulating nonmagnetic material layer, wherein each of the plurality of second through holes is defined as one of the plurality of second adsorption positions.

10. The method according to claim 9, wherein forming both the first insulating nonmagnetic material layer and the second insulating nonmagnetic material layer are carried out by chemical vapor deposition.

11. The method according to claim 9, wherein defining both the plurality of first through holes and the plurality of second through holes are carried out by laser patterning.

12. The method according to claim 9, further comprising forming both the first insulating nonmagnetic material layer and the second insulating nonmagnetic material layer by a polyimide-based composite material.

13. The method according to claim 7, providing the receiving substrate comprising providing a substrate, forming a thin film transistor (TFT) array layer on the substrate, and forming an insulating layer on a side of the TFT array layer away from the substrate layer, wherein the insulating layer defines a plurality of contact holes exposing the TFT array layer, each of the plurality of contact hole is defined as one of the plurality of receiving areas.

14. The method according to claim 13, further comprising forming an infill layer on a side of the insulating layer away from the substrate, and the infill layer fills at least a periphery of each of the plurality of light emitting elements.

* * * * *